United States Patent
Wang et al.

(10) Patent No.: US 10,840,619 B1
(45) Date of Patent: Nov. 17, 2020

(54) ASSEMBLING STRUCTURE FOR EXPANSION CARD

(71) Applicant: Wistron Corporation, New Taipei (TW)

(72) Inventors: Jun-Hao Wang, New Taipei (TW); Tai-Hsun Wu, New Taipei (TW); Ching-Hao Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/563,915

(22) Filed: Sep. 8, 2019

(30) Foreign Application Priority Data

Apr. 24, 2019 (CN) .......................... 2019 1 0334642

(51) Int. Cl.
  *H01R 12/70* (2011.01)
  *H01R 12/73* (2011.01)
  *H05K 7/14* (2006.01)
(52) U.S. Cl.
  CPC ....... *H01R 12/7005* (2013.01); *H01R 12/737* (2013.01); *H05K 7/1418* (2013.01)
(58) Field of Classification Search
  CPC .................................................. H01R 12/7005
  See application file for complete search history.

(56) References Cited

U.S. PATENT DOCUMENTS

| 9,261,921 | B2* | 2/2016 | Li .............................. G06F 1/18 |
| 9,310,853 | B2* | 4/2016 | Yu ......................... H05K 7/1487 |
| 9,935,384 | B1* | 4/2018 | Li ....................... H01R 13/6335 |
| 2014/0313678 | A1 | 10/2014 | Yin et al. |

FOREIGN PATENT DOCUMENTS

TW          201442600          11/2014

OTHER PUBLICATIONS

"Office Action of Taiwan Counterpart Application", dated Feb. 27, 2020, p. 1-p. 6.

* cited by examiner

*Primary Examiner* — Ross N Gushi
(74) *Attorney, Agent, or Firm* — JCIPRNET

(57) ABSTRACT

An assembling structure for an expansion card includes a frame and a supporting positioning element. The frame includes a body, a first assembling portion and a second assembling portion, wherein the body has a first side, a second side and a third side. The first assembling portion is disposed at the first side and the second assembling portion is disposed at the second side. The body is configured with a positioning portion close to the third side. The supporting positioning element is slidably connected to and pivoted to the positioning portion, wherein the supporting positioning element includes a first supporting positioning portion and a second supporting positioning portion. The supporting positioning element faces the second assembling portion via the first supporting positioning portion or the second supporting positioning portion.

12 Claims, 9 Drawing Sheets

ASSEMBLING STRUCTURE FOR EXPANSION CARD

CROSS-REFERENCE TO RELATED APPLICATION

This application claims the priority benefit of China application serial no. 201910334642.8, filed on Apr. 24, 2019. The entirety of the above-mentioned patent application is hereby incorporated by reference herein and made a part of this specification.

BACKGROUND

Technical Field

The disclosure relates to an assembling structure, and more particularly to an assembling structure for an expansion card.

Description of Related Art

As data processing volume increases, most of the existing computer hosts, servers, or workstations can support and assemble multiple expansion cards or expansion modules to perform high-performance computing. In terms of the structure and size of the commonly seen expansion cards such as graphics processing cards (GPU cards) and PCIe cards, although the position of the electrical contact (such as the gold finger) of the graphics processing cards is the same as or similar with that of the PCIe cards, and the orientation for plugging/pulling the electrical contact of the graphics processing cards into/out the electrical connection socket of the frame is the same as or similar with that of the PCIe cards, the overall size of the graphics processing cards and PCIe cards are still different.

After assembling the expansion card on the frame and assembling the frame on the casing of the computer host, server or workstation, at least one end of the expansion card is not supported by the frame and is suspended above the casing. If the end of the expansion card suspended above the casing is not supported and fixed, the vibration generated by the computer host, server or workstation during operation may cause the expansion card to loose relative to the frame, or even damage the electrical contact of the expansion card or cause the electrical contact of the expansion card to loose from the electrical connection socket of the frame and lead to unstable signal transmission.

Since different kinds of expansion cards have different sizes, the issue of how to develop a supporting structure that can be compatible for all kinds of expansion cards to support the ends of all kinds of expansion cards suspended above the casing and to improve the assembling reliability between all kinds of expansion cards and frames has become one of the key research projects that relevant manufacturers are actively working on.

SUMMARY

The disclosure provides an assembling structure for an expansion card that is compatible for at least two different sizes of expansion cards and has good reliability.

The assembling structure for the expansion card of the disclosure is suitable for assembling the expansion card. The assembling structure for the expansion card includes a frame and a supporting positioning element. The frame includes a body, a first assembling portion and a second assembling portion, wherein the body has a first side, a second side, and a third side opposite to the second side. The first side is between the second side and the third side. The first assembling portion is disposed on the first side and the second assembling portion is disposed on the second side. The body has a positioning portion close to the third side. The supporting positioning element is slidably connected to and pivoted to the positioning portion, wherein the supporting positioning element includes a first supporting positioning portion and a second supporting positioning portion opposite to each other. The supporting positioning element faces the second assembling portion via the first supporting positioning portion or the second supporting positioning portion.

In an embodiment of the disclosure, the supporting positioning element includes a first coupling portion and a supporting portion opposite to the first coupling portion. The first coupling portion and the supporting portion are respectively located at the two opposite sides of the first supporting positioning portion and the second supporting positioning portion. The positioning portion has a first guiding slot, and the first coupling portion is slidably connected to and pivoted to the first guiding slot.

In an embodiment of the disclosure, the extension direction of the first guiding slot intersects the second side and the third side.

In an embodiment of the disclosure, the supporting positioning element further includes a second coupling portion adjacent to the first coupling portion. The second coupling portion and the supporting portion are respectively located at the two opposite sides of the first supporting positioning portion and the second supporting positioning portion. The positioning portion also has a second guiding slot adjacent to the first guiding slot, and the second coupling portion is slidably connected to and pivoted to the second guiding slot.

In an embodiment of the disclosure, the second guiding slot has a first engaging point and a second engaging point opposite to each other, and the second engaging point is between the first engaging point and the third side.

In an embodiment of the disclosure, the second guiding slot has a first guiding section and a second guiding section connected to each other, and the extension direction of the first guiding slot is parallel to the extension direction of the first guiding section.

In an embodiment of the disclosure, the first guiding slot has a first end point and a second end point opposite to each other, and the second end point is located between the first end point and the third side. The first end point is located between the second guiding section and the second end point, and the second guiding section surrounds the first end point.

In an embodiment of the disclosure, the second guiding section is an arc-shaped section, and the concave arc surface of the arc-shaped section faces the first end point of the first guiding slot.

In an embodiment of the disclosure, the first coupling portion is located in the first guiding slot, and the second coupling portion is located in the first guiding section of the second guiding slot. The straight line between a center of the first coupling portion and a center of the second coupling portion is perpendicular to the extension direction of the first guiding slot.

In an embodiment of the disclosure, the first coupling portion includes a head portion and a pillar portion connected to the head portion. The pillar portion is inserted in the first guiding slot, and the head portion extends out through the first guiding slot.

In an embodiment of the disclosure, the first coupling portion has an open slot penetrating through the head portion and a portion of the pillar portion, and the head portion is divided into two sub-head portions opposite to each other.

In an embodiment of the disclosure, the first assembling portion is configured with an electrical connection socket, and the expansion card is configured with an electrical contact. The electrical contact is configured to plug into the electrical connection socket.

In an embodiment of the disclosure, the supporting positioning element faces the second assembling portion via the first supporting positioning portion, and a first distance is kept between the first supporting positioning portion and the second assembling portion. Or, the supporting positioning element faces the second assembling portion via the second supporting positioning portion, and a second distance greater than the first distance is kept between the second supporting positioning portion and the second assembling portion.

Based on the above, the assembling structure for the expansion card of the disclosure is configured with the supporting positioning element that can be compatible for at least two different sizes of expansion cards. The operator can adjust the position and direction of the supporting positioning element on the frame according to the size of the expansion cards. Also, after the supporting positioning element is moved and positioned, the operator can lock the supporting positioning element to the frame to prevent the supporting positioning element from arbitrarily sliding or rotating relative to the frame. As such, after the expansion card is assembled to the frame, the end of the expansion card that is not supported by the frame can be supported and fixed by the supporting positioning element to prevent the expansion card from loosening from the frame and to improve the assembling reliability between the expansion card and the frame.

In order to make the features and advantages of the disclosure comprehensible, embodiments accompanied with drawings are described in detail below.

DESCRIPTION OF THE EMBODIMENTS

Figure 1A:
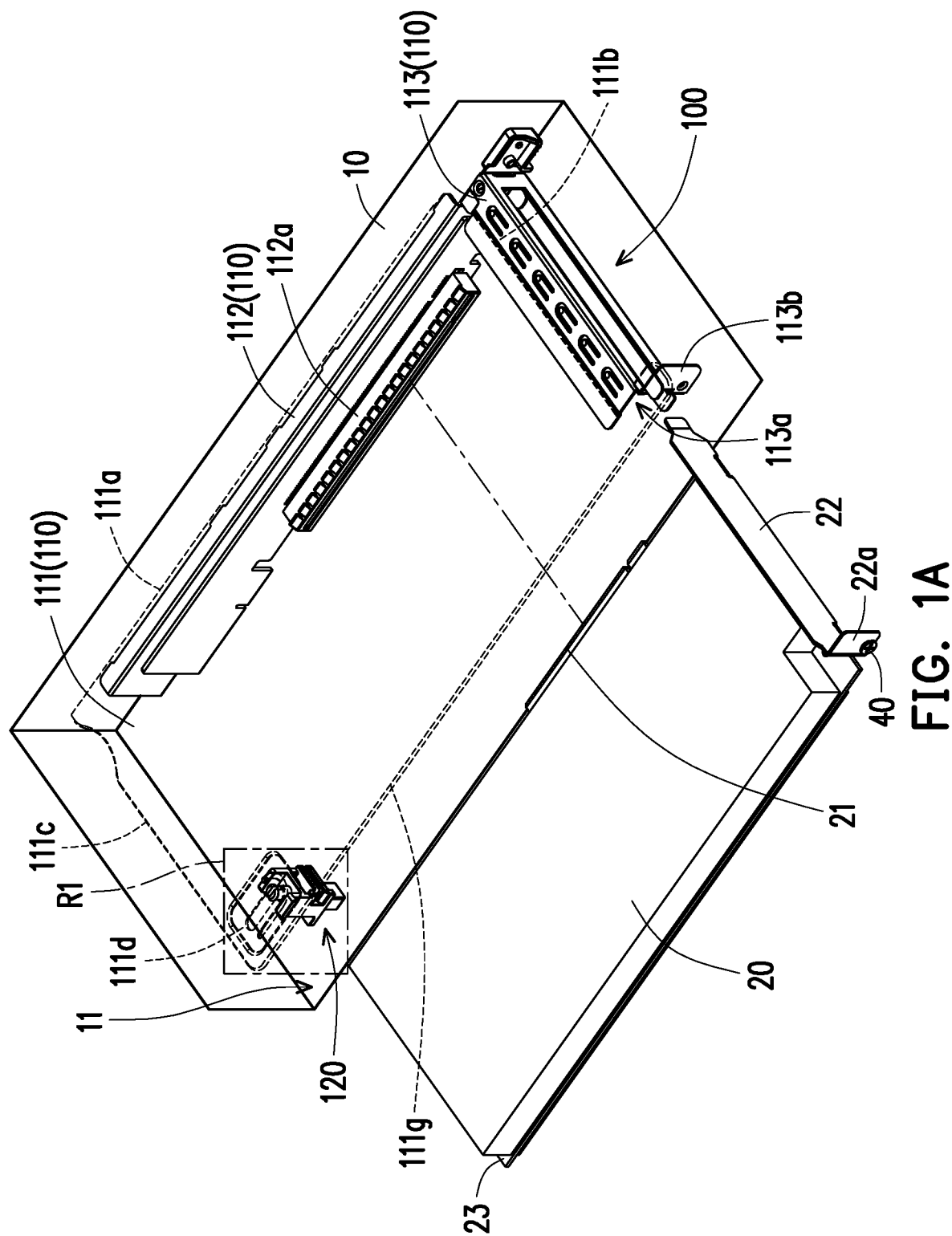
FIG. 1A and FIG. 1B are respectively schematic views of an assembling structure for an expansion card and a first expansion card before and after assembly according to an embodiment of the disclosure.
Figure 1B:
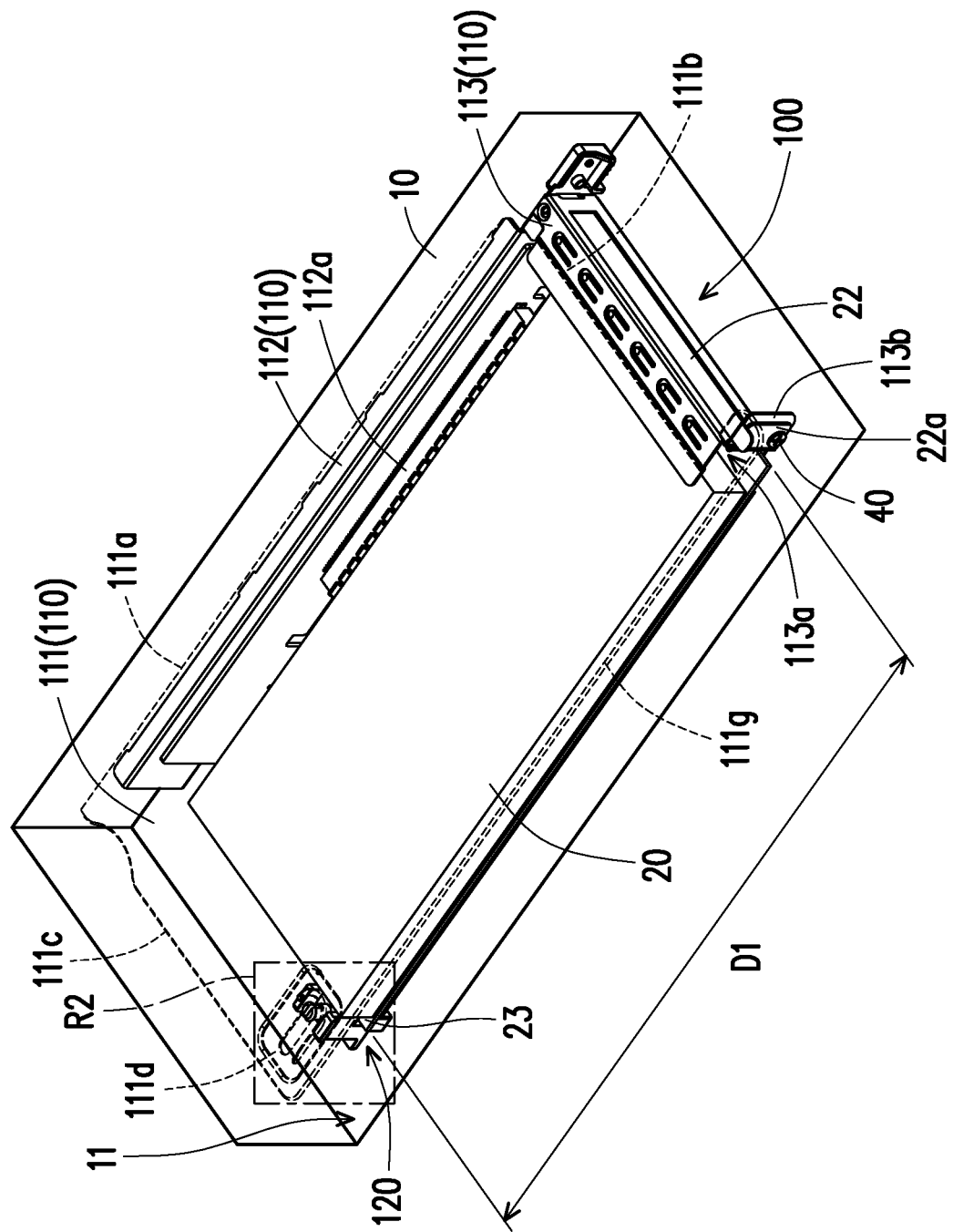
Figure 2:
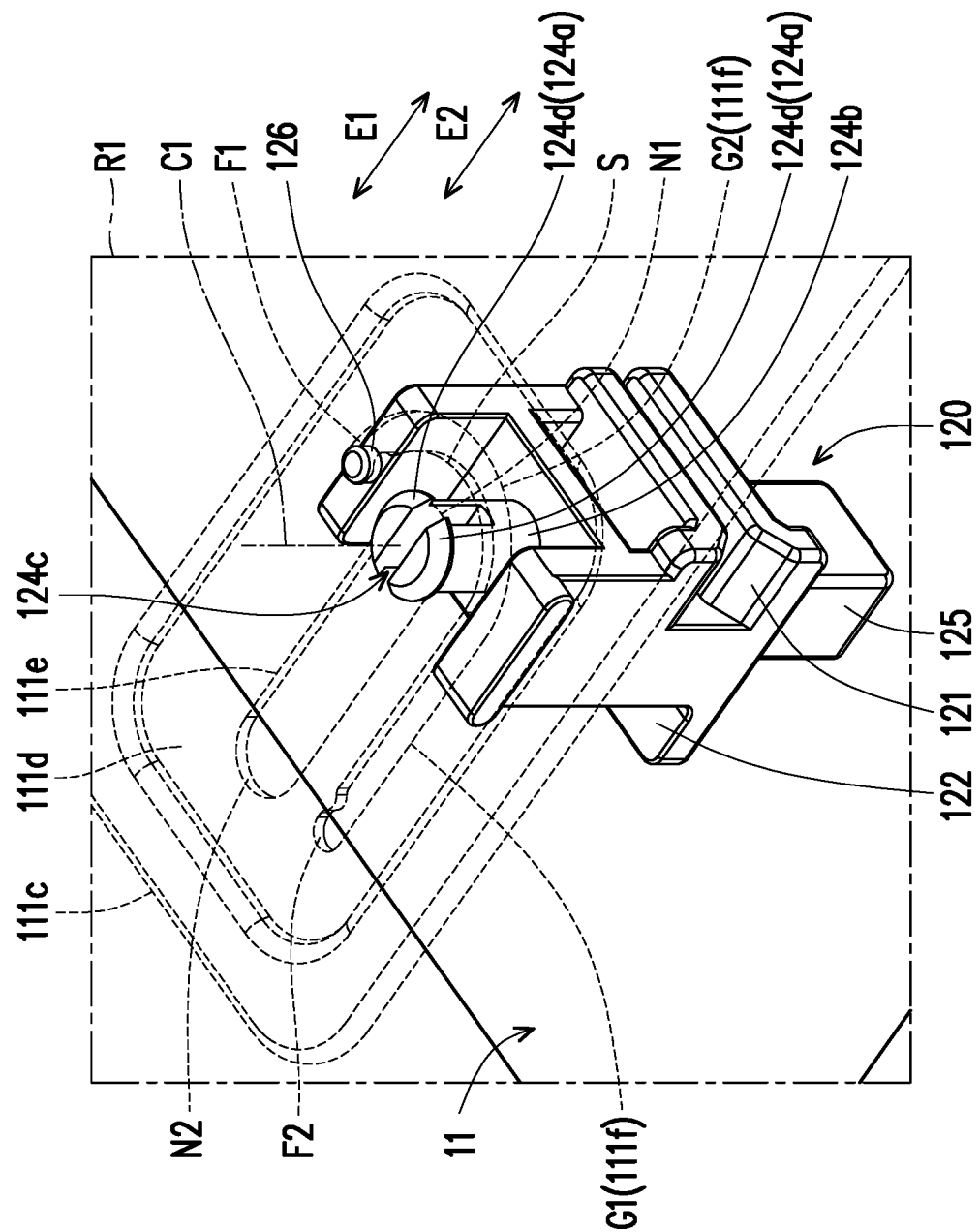
FIG. 2 is a partial enlarged view of a region R1 of FIG. 1A.
Figure 3:
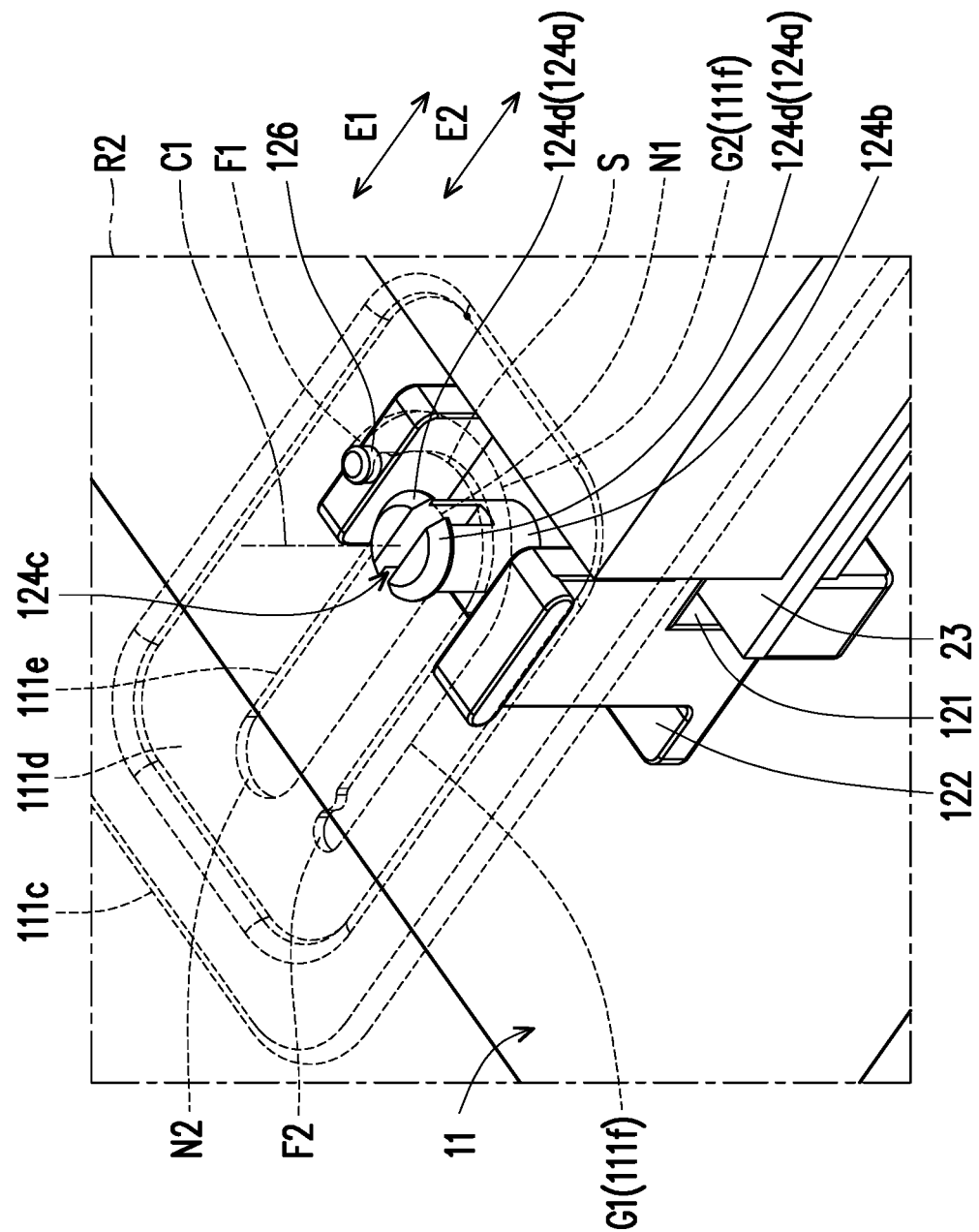
FIG. 3 is a partial enlarged view of a region R2 of FIG. 1B.

FIG. 1A and FIG. 1B are respectively the schematic views of an assembling structure for an expansion card and a first expansion card before and after assembly according to an embodiment of the disclosure. FIG. 2 is a partial enlarged view of a region R1 of FIG. 1A. FIG. 3 is a partial enlarged view of a region R2 of FIG. 1B. For clarity, a body 111 of a frame 110 in the drawings is shown in dashed lines and schematically illustrates a portion of a casing 10. First, with reference to FIG. 1A and FIG. 1B, in this embodiment, an assembling structure 100 for the expansion card is detachably assembled to a casing 10 of a host computer, a server or a workstation. Also, the assembling structure 100 of the expansion card includes the frame 110 and a supporting positioning element 120 that is detachably assembled on the frame 110. The frame 110 is, for example, suspended above a bottom surface 11 of the casing 10, wherein a side of the frame 110 can be assembled to an inner wall surface of the casing 10 and the frame 110 can abut against the bottom surface 11 of the casing 10 via the supporting positioning element 120 to improve the stability when the expansion card is assembled thereon.

Further, the frame 110 includes the body 111, a first assembling portion 112, and a second assembling portion 113. The body 111 has a first side 111a, a second side 111b, and a third side 111c opposite to the second side 111b, wherein the first side 111a is located between the second side 111b and the third side 111c, and the first side 111a connects the second side 111b and the third side 111c. On the other hand, the first assembling portion 112 is disposed at the first side 111a and located between the body 111 and the bottom surface 11 of the casing 10. The second assembling portion 113 is disposed at the second side 111b and located between the body 111 and the bottom surface 11 of the casing 10. The first assembling portion 112 is configured with an electrical connection socket 112a, wherein the electrical connection socket 112a is located between the body 111 and the bottom surface 11 of the casing 10 for matching with an electrical contact 21 of a first expansion card 20. After the first expansion card 20 is assembled to the frame 110, the electrical contact 21 of the first expansion card 20 is plugged into an electrical connection socket 112a of the first assembling portion 112.

The second assembling portion 113 has an assembling guiding slot 113a, wherein the assembling guiding slot 113a faces the third side 111c and can be configured to guide the disassembly and assembly of the first expansion card 20. For example, during the process of disassembling and assembling the first expansion card 20, a first end 22 of the first expansion card 20 slides within the assembling guiding slot 113a, and the second assembling portion 113 can be configured to support the first end 22 of the first expansion card 20. On the other hand, one side of the first end 22 is configured with an abutting member 22a, and one side of the second assembling portion 113 away from the first side 111a is configured with a leaning member 113b. After the first expansion card 20 is assembled and positioned, the abutting member 22a abuts the leaning member 113b and the abutting member 22a is locked and fixed to the abutting member 113b by a screw 40. If the first expansion card 20 is going to be disassembled, the screw 40 should be removed first.

With reference to FIG. 1A, FIG. 1B, FIG. 2 and FIG. 3, the body 111 is configured with a positioning portion 111d close to the third side 111c. The shortest distance between the positioning portion 111d and the third side 111c is much smaller than the shortest distance between the positioning portion 111d and the second side 111b. For example, the body 111 also has a fourth side 111g opposite to the first side 111a, wherein the fourth side 111g connects the second side 111b and the third side 111c. The positioning portion 111d is, for example, at a corner between the fourth side 111g and the third side 111c.

On the other hand, the supporting positioning element 120 is slidably connected to and pivoted to the positioning portion 111d. The supporting positioning element 120 includes a first supporting positioning portion 121 and a second supporting positioning portion 122 opposite to each other. Depending on the size of the expansion card, an operator can adjust the position and direction of the supporting positioning element 120 on the positioning portion 111d. For example, the first expansion card 20 may be a PCIe card. In view of the size of the first expansion card 20, the operator needs to make the first supporting positioning portion 121 face the second assembling portion 113. Among this, a first distance D1 is kept between the first supporting positioning portion 121 and the second assembling portion 113, and the first distance D1 can match the length of the first expansion card 20.

The first expansion card 20 has a second end 23 opposite to the first end 22. During the process of disassembling and assembling the first expansion card 20, the first end 22 of the first expansion card 20 slides relative to the second assembling portion 113 and leans against the second assembling portion 113. The second end 23 of the first expansion card 20 slides relative to the first supporting positioning portion 121 and leans against the first supporting positioning portion 121. In other words, the second assembling portion 113 and the first supporting positioning portion 121 which are arranged side by side can be configured to guide the disassembly and assembly of the first expansion card 20, thereby improving the convenience and stability of disassembling and assembling the first expansion card 20 for the operator.

After the first expansion card 20 is assembled to the right position, the electrical contact 21 of the first expansion card 20 is plugged into the electrical connection socket 112a of the first assembling portion 112. Besides, the first end 22 leans against the second assembling portion 113 and the second end 23 leans against the first supporting positioning portion 121. Accordingly, the frame 110 and the supporting positioning element 120 can form a three-point support for the first expansion card 20, which helps to reduce the vibration amplitude of the first expansion card 20 when the host computer, server or workstation is in operation. Furthermore, the electrical contact 21 of the first expansion card 20 can be firmly and securely plugged into the electrical connection socket 112a of the frame 110 to prevent the electrical contact 21 of the first expansion card 20 from being damaged and to improve the stability of signal transmission.

With reference to FIG. 1A, FIG. 1B, FIG. 2 and FIG. 3, the first supporting positioning portion 121 and the second supporting positioning portion 122 may respectively include a positioning slot for the corresponding expansion card to be inserted therein. For example, the positioning slot of the first positioning portion 121 may be a U-shaped slot, and the positioning slot of the second supporting positioning portion 122 may be an L-shaped slot. It should be noted that the structure of the positioning slot of the first supporting positioning portion 121 and the positioning slot of the second supporting positioning portion 122 is not limited to this, and can be adjusted according to actual needs. In response to the disassembly and assembly of the first expansion card 20, the positioning slot of the first supporting positioning portion 121 faces the assembling guiding slot 113a of the second assembling portion 113. Among this, the first end 22 is configured to slide within assembling guiding slot 113a, and a portion of the second end 23 is configured to slide within the positioning slot of the first supporting positioning portion 121.

Figure 4:
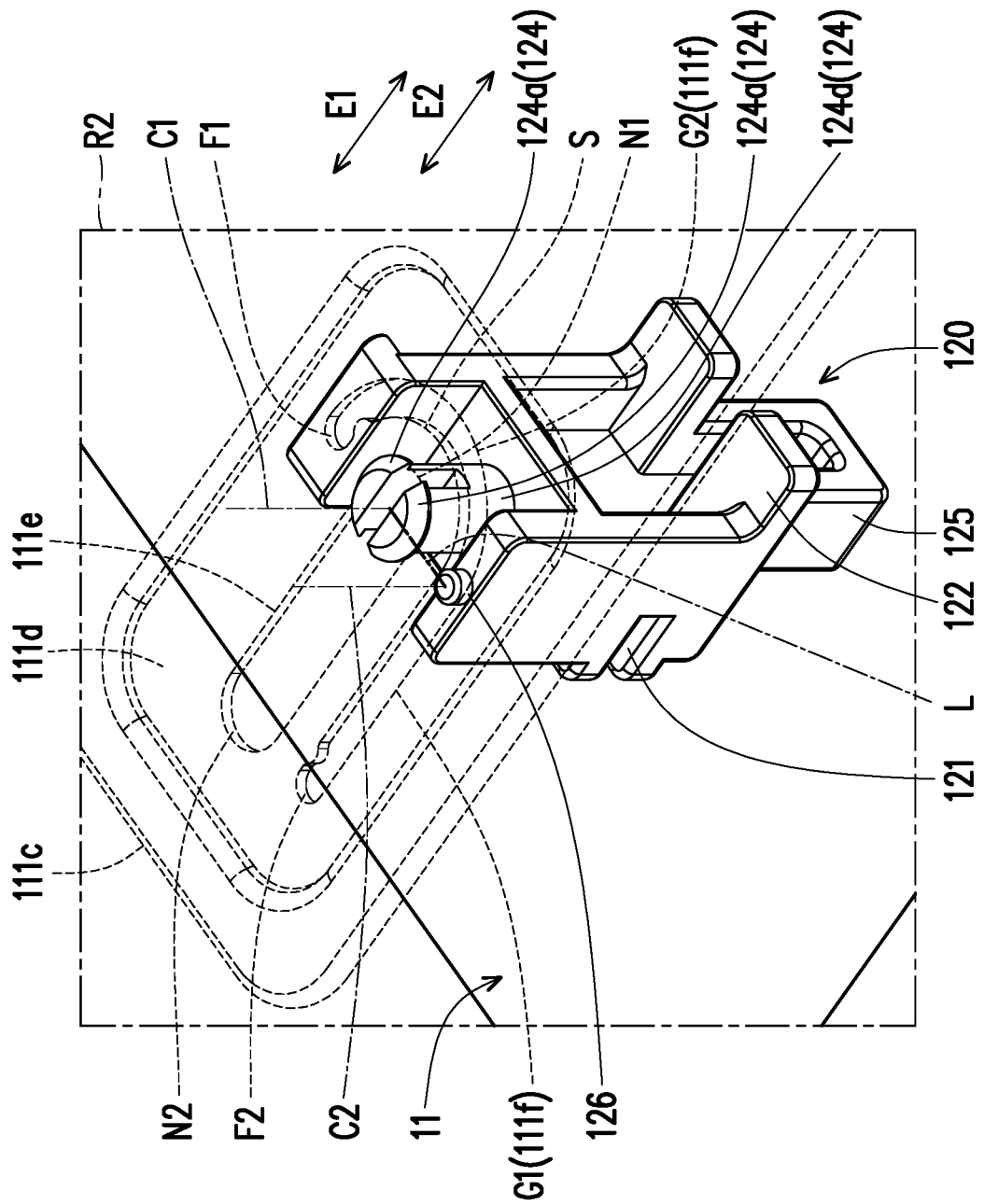
FIG. 4 is a partial enlarged view of a supporting positioning element of FIG. 3 moved to a transition position.

FIG. 4 is a partial enlarged view of the supporting positioning element of FIG. 3 moved to a transition position. With reference to FIG. 1A, FIG. 2 and FIG. 4, after detaching the first expansion card 20 from the frame 110, the operator can adjust the position and direction of the supporting positioning element 120 on the positioning portion 111d according to the size of other expansion cards, which is helpful for continuing the assembly of other expansion cards. Specifically, the supporting positioning element 120 further includes a first coupling portion 124 and a supporting portion 125 opposite to the first coupling portion 124. The first coupling portion 124 and the supporting portion 125 are respectively located at the two opposite sides of the first supporting positioning portion 121 and the second supporting positioning portion 122. The supporting portion 125 is configured for abutting against the bottom surface 11 of the casing 10. The first coupling portion 124 is slidably connected to and pivoted to the positioning portion 111d.

Further, the positioning portion 111d has a first guiding slot 111e, and the first coupling portion 124 is slidably connected to and pivoted to the first guiding slot 111e. For example, an extending direction E1 of the first guiding slot 111e may be intersected with the second side 111b and the third side 111c. Among this, the first guiding slot 111e may extend from the third side 111c toward the second side 111b, and the extending direction E1 may be parallel to the first side 111a. In this embodiment, the first guiding slot 111e has a first end point N1 and a second end point N2 opposite to each other. Among this, the second end point N2 is closer to the third side 111c than the first end point N1, and the second end point N2 is located between the first end point N1 and the third side 111c. That is, the distance between the first end point N1 and the third side 111c is greater than the distance between the second end point N2 and the third side 111c. Also, the extension length of the first guiding slot 111e is configured to determine the sliding stroke of the supporting positioning element 120.

As shown in FIG. 2, the first coupling portion 124 is located at the first end point N1. Also, the supporting positioning element 120 can be rotated relative to the body 111 according to the first coupling portion 124 that is served as a rotation axis, and thus making the second supporting positioning portion 122 face the second assembling portion 113 (see FIG. 1A), as shown in FIG. 4.

Specifically, the supporting positioning element 120 further includes a second coupling portion 126, wherein the second coupling portion 126 is adjacent to the first coupling portion 124, and the first coupling portion 124 and the second coupling portion 126 are located at the same side of the body portion 123. That is, the second coupling portion 126 and the supporting portion 125 are respectively located at the two opposite sides of the first supporting positioning portion 121 and the second supporting positioning portion 122. On the other hand, the positioning portion 111d also has a second guiding slot 111f adjacent to the first guiding slot 111e, and the second coupling portion 126 is slidably connected to and pivoted to the second guiding slot 111f.

In this embodiment, the second guiding slot 111f has a first guiding section G1 and a second guiding section G2 connected to each other. Among this, the extension direction E1 of the first guiding slot 111e is parallel to an extension direction E2 of the first guiding section G1, the first end point N1 is located between the second guiding section G2 and the second end point N2, and the second guiding section G2 surrounds the first end point N1 of the first guiding slot 111e. The second guiding section G2 may be an arc-shaped section, and the concave arc surface S of the arc-shaped section faces the first end point N1 of the first guiding slot 111e. For example, the second guiding section G2 may be a circular arc. When the first coupling portion 124 is held at the first end point N1, the center of the circular arc falls at a center C1 of the first coupling portion 124. According to this, based on the cooperation of the second coupling portion 126 and the second guiding section G2 of the second guiding slot 111f, the operator can make the supporting positioning element 120 rotate relative to the body 111 according to the first coupling portion 124 that is served as the rotation axis. Also, during the rotation of the supporting positioning element 120 relative to the body 111, the supporting positioning element 120 would not slide relative to the body 111.

Please continue to refer to FIG. 1A, FIG. 2 and FIG. 4, the second guiding slot 111f also has a first engaging point F1 and a second engaging point F2 opposite to each other. Among this, the second engaging point F2 is closer to the third side 111c than the first engaging point F1, and the second engaging point F2 is located between the first engaging point F1 and the third side 111c. Further, the first engaging point F1 is adjacent to the first end point N1, and the second engaging point F2 is adjacent to the second end point N2. Furthermore, the distance between the first engaging point F1 and the third side 111c is roughly equal to the distance between the first end point N1 and the third side 111c. The distance between the second engaging point F2 and the third side 111c is roughly equal to the distance between the second end point N2 and the third side 111c. Accordingly, when the first coupling portion 124 is held at the first end point N1 and the second coupling portion 126 is held at the first engaging point F1, the first supporting positioning portion 121 can directly face and be aligned with the assembling guiding slot 113a without skewing.

In this embodiment, the first engaging point F1 falls within the second guiding section G2, and the second engaging point F2 falls within the first guiding section G1. The first engaging point F1 and the first end point N1 roughly fall on the same line perpendicular to the extension direction E1 of the first guiding slot 111e. The second engaging point F2 and the second end point N2 roughly fall on the same line perpendicular to the extension direction E1 of the first guiding slot 111e. Under the state shown in FIG. 2, the second coupling portion 126 is engaged with the first engaging point F1 to prevent the supporting positioning element 120 from arbitrarily rotating relative to the body 111. Depending on the assembly requirements, the operator can apply a force to release the engagement between the second coupling portion 126 and the first engaging point F1, and make the supporting positioning element 120 to rotate relative to the body 111 according to the first coupling portion 124 that is served as the rotation axis, and thus making the second coupling portion 126 move to the junction of the second guiding section G2 and the first guiding section G1, as shown in FIG. 4. At this time, and the first coupling portion 124 remains at the first end point N1.

Figure 5A:
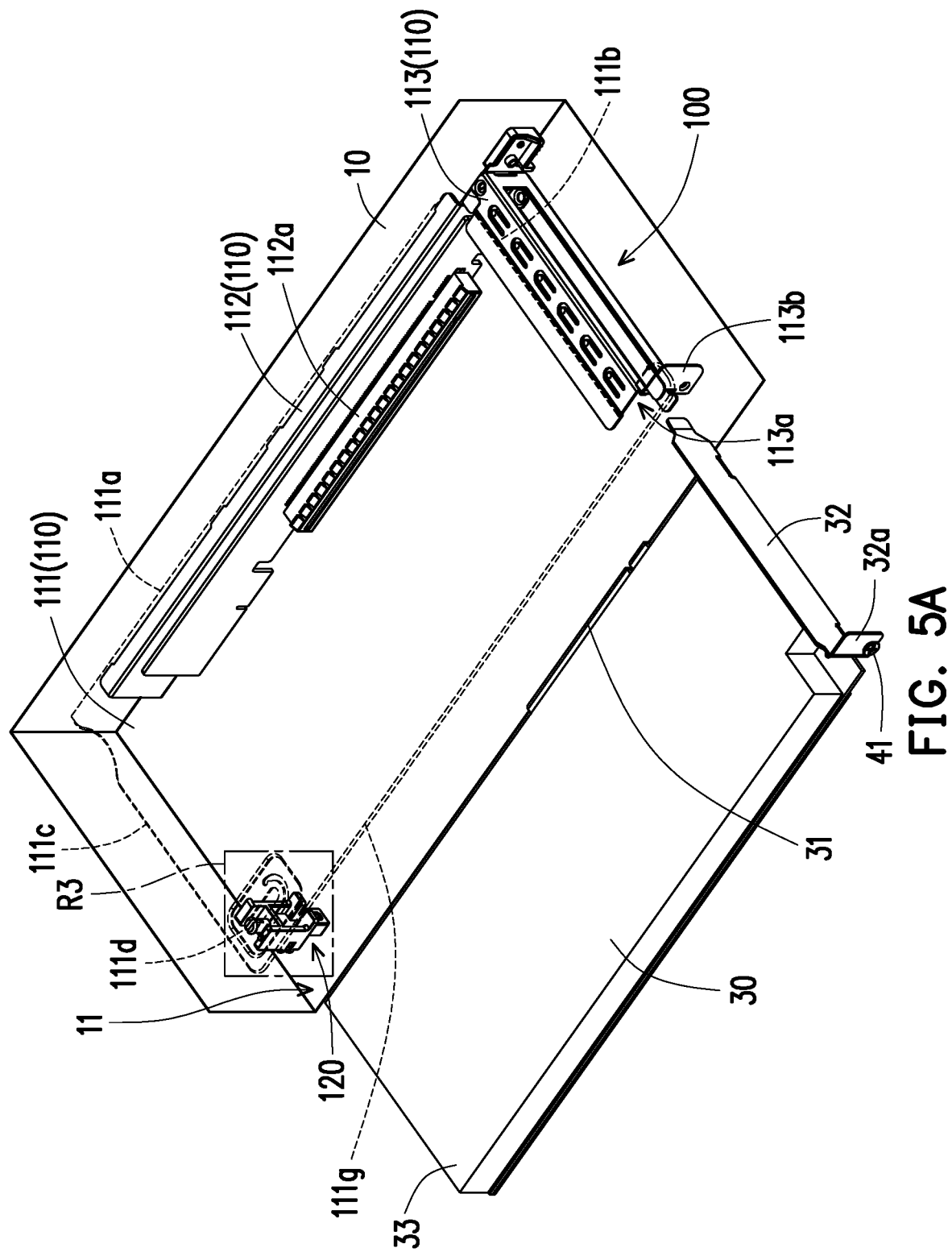
FIG. 5A and FIG. 5B are schematic views of the assembling structure for the expansion card and a second expansion card before and after the assembly according to an embodiment of the disclosure.
Figure 5B:
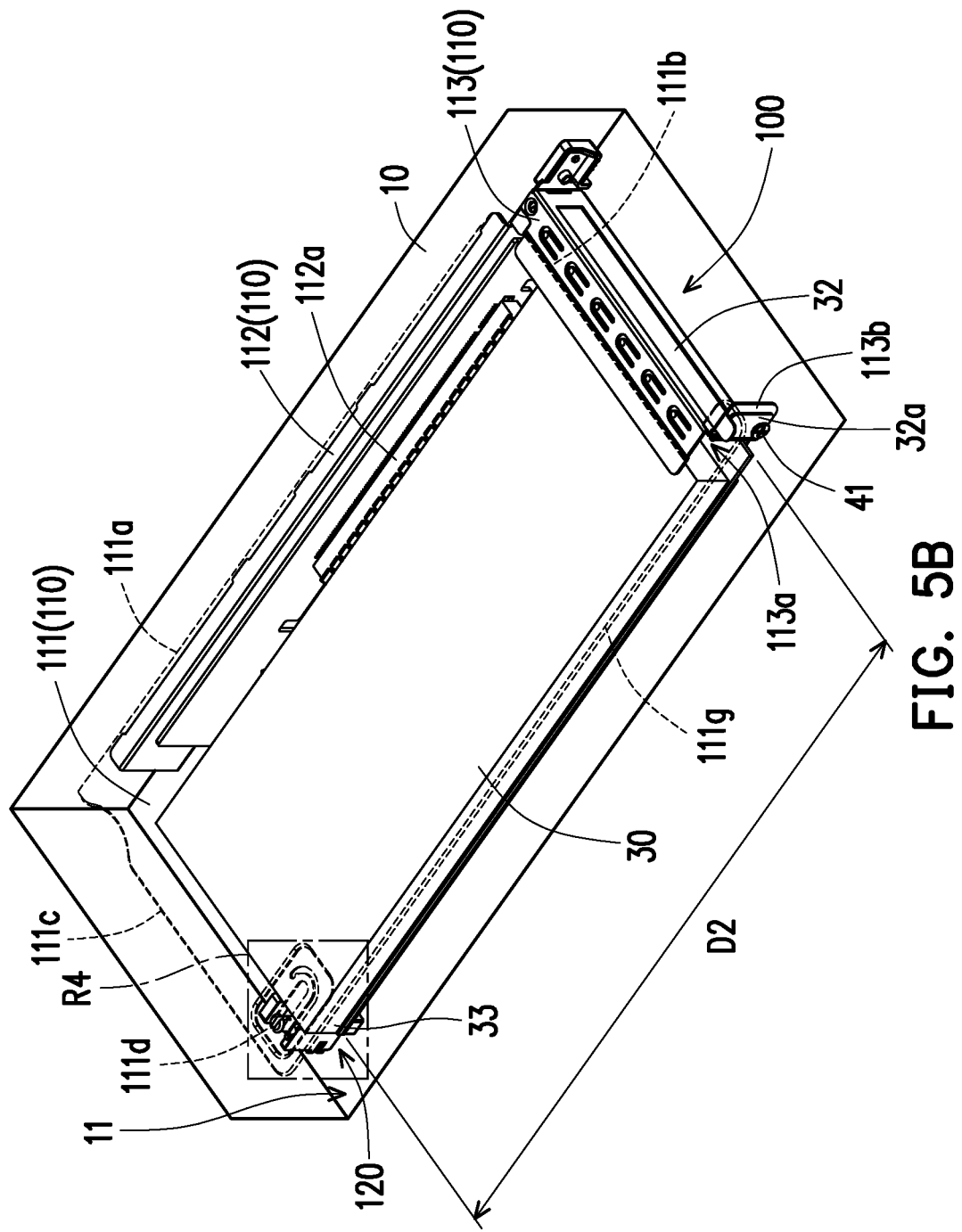
Figure 6:
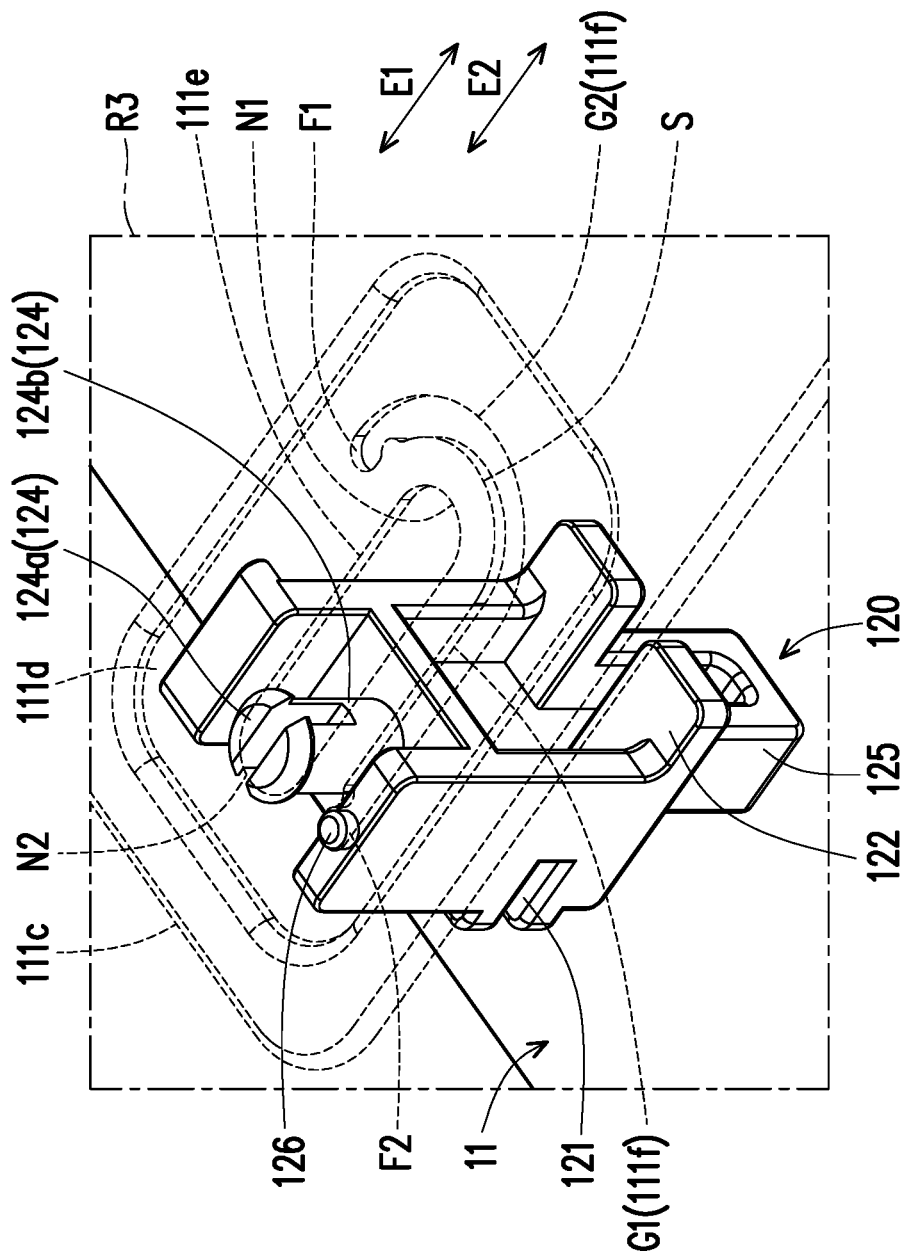
FIG. 6 is a partial enlarged view of a region R3 of FIG. 5A.
Figure 7:
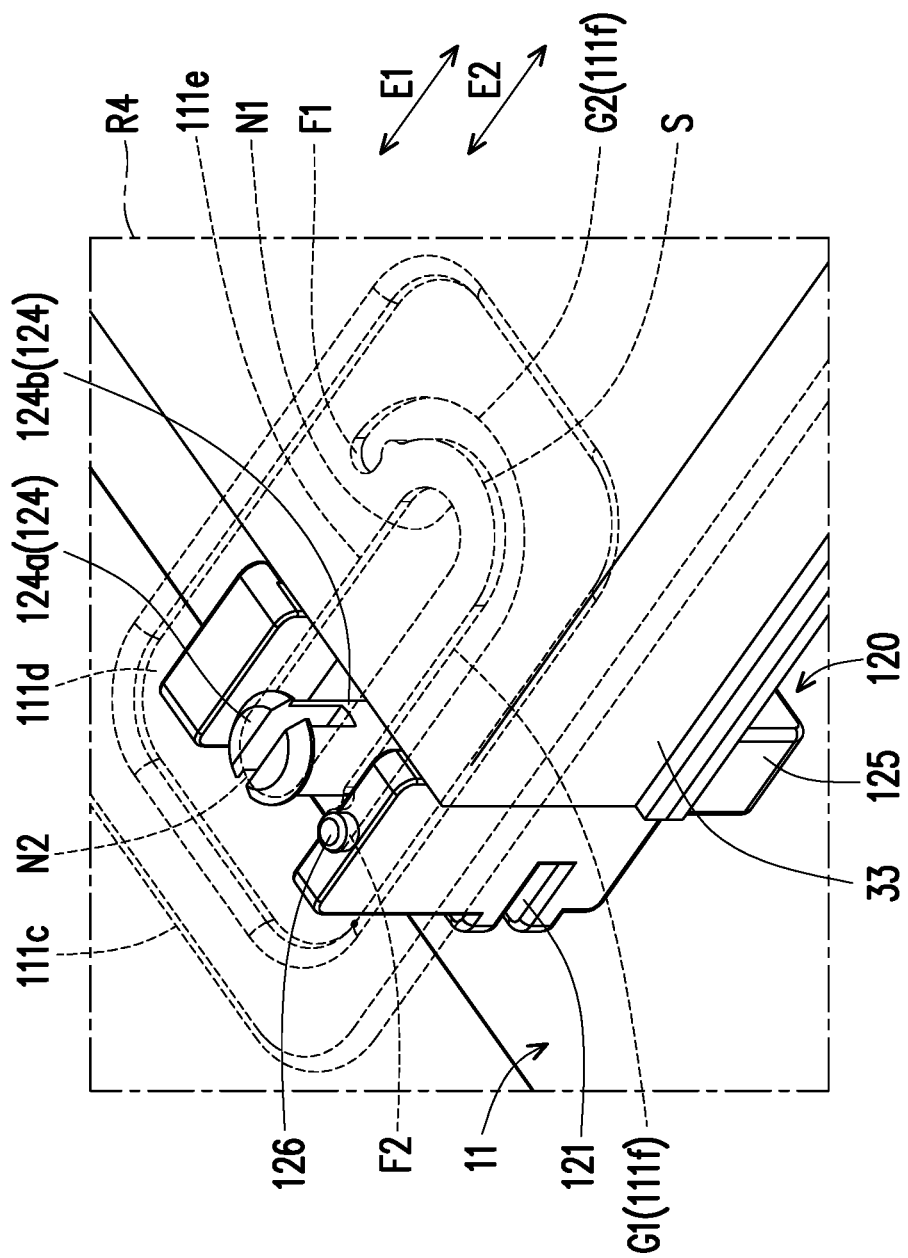
FIG. 7 is a partial enlarged view of a region R4 of FIG. 5B.

FIG. 5A and FIG. 5B are schematic views of the assembling structure for the expansion card and the second expansion card before and after the assembly according to an embodiment of the disclosure. FIG. 6 is a partial enlarged view of a region R3 of FIG. 5A. FIG. 7 is a partial enlarged view of a region R4 of FIG. 5B. For clarity, the body 111 of the frame 110 in the drawings is shown in dashed lines and schematically illustrates the portion of the casing 10. Referring first to FIG. 4, FIG. 5A and FIG. 6, after the first expansion card 20 (see FIG. 1A) is detached, and before a second expansion card 30 is assembled, the operator needs to move the supporting positioning element 120 closer to the third side 111c. In the process of moving the supporting positioning element 120 closer to the third side 111c, the first coupling portion 124 moves from the first end point N1 within the first guiding slot 111e to the second end point N2. The second coupling portion 126 moves from the junction of the second guiding section G2 and the first guiding section G1 to the second engaging point F2 within the first guiding section G1. After the second coupling portion 126 is moved to the second engaging point F2 within the first guiding section G1, the second coupling portion 126 is engaged with the second engaging point F2 to prevent the supporting positioning element 120 from arbitrarily sliding relative to the body 111. On the other hand, the distance between the second engaging point F2 and the third side 111c is roughly equal to the distance between the second end point N2 and the third side 111c. Accordingly, when the first coupling portion 124 is held at the second end point N2 and the second coupling portion 126 is held at the second engaging point F2, the second supporting positioning portion 122 can directly face and be aligned with the assembling guiding slot 113a without skewing.

In this embodiment, the first guiding slot 111e is parallel to the first guiding section G1 of the second guiding slot 111f, wherein the first coupling portion 124 is slidably disposed in the second guiding slot 111f, and the second coupling portion 126 is slidably disposed in the first guiding section G1. Moreover, a straight line L between the center C1 of the first coupling portion 124 and a center C2 of the second coupling portion 126 is perpendicular to the extension direction E1 of the first guiding slot 111e. Therefore, during the movement of the supporting positioning element 120 from the position shown in FIG. 4 to the position shown in FIG. 6, the supporting positioning element 120 would not arbitrarily rotate relative to the body 111.

With reference to FIG. 5A, FIG. 5B, FIG. 6 and FIG. 7, after the second coupling portion 126 is engaged with the second engaging point F2, the supporting positioning element 120 faces the second assembling portion 113 via the second supporting positioning portion 122. Also, a second distance D2 greater than the first distance D1 (see FIG. 1B) is kept between the second supporting positioning portion 122 and the second assembling portion 113. For example, the second expansion card 30 can be a graphics processing card, and the second distance D2 can match the length of the second expansion card 30.

The second expansion card 30 has a first end 32 and a second end 33 opposite to each other. During the process of disassembling and assembling the second expansion card 30, the first end 32 of the second expansion card 30 slides relative to the second assembling portion 113 and leans against the second assembling portion 113. The second end 33 of the second expansion card 30 slides relative to the second supporting positioning portion 122 and leans against the second supporting positioning portion 122 (the second supporting positioning portion 122 in FIG. 7 is not marked because it is shielded by the second end 33 of the second expansion card 30). In other words, the second assembling portion 113 and the second supporting positioning portion 122 which are arranged side by side can be configured to guide the disassembly and assembly of the second expansion card 30, thereby improving the convenience and stability of disassembling and assembling the second expansion card 30 for the operator.

After the second expansion card 30 is assembled and positioned, an electrical contact 31 of the second expansion card 30 is plugged into the electrical connection socket 112a of the first assembling portion 112, the first end 32 leans against the second assembling portion 113 and the second end 33 leans against the second assembling portion 122. Accordingly, the frame 110 and the supporting positioning element 120 can form a three-point support for the second expansion card 30, which helps to reduce the vibration amplitude of the second expansion card 30 when the host computer, server or workstation is in operation. Furthermore, the electrical contact 31 of the second expansion card 30 can be firmly and securely plugged into the electrical connection socket 112a of the frame 110 to prevent damage to the electrical contact 31 of the second expansion card 30 and improve the stability of signal transmission.

On the other hand, one side of the first end 32 is configured with an abutting member 32a. After the second expansion card 30 is assembled and positioned, the abutting member 32a abuts against the leaning member 113b, and the abutting member 32a is locked and fixed to the leaning member 113b by the screw 41. If the second expansion card 30 is going to be disassembled, the screw 41 should be removed first.

With reference to FIG. 2, in this embodiment, the supporting positioning element 120 can be detached from the positioning portion 111d of the body 111. In order to facilitate the disassembly and assembly for the operator and ensure the reliability of the disassembly and assembly, the structural design of the supporting positioning element 120 is described as follows. Specifically, the first coupling portion 124 includes a head portion 124a and a pillar portion 124b connected to the head portion 124a, and an outer diameter of the head portion 124a is larger than an outer diameter of the pillar portion 124b. The pillar portion 124b is inserted in the first guiding slot 111e, and the head portion 124a extends out through the first guiding slot 111e. In a direction perpendicular to the extension direction E1 of the first guiding slot 111e, the outer diameter of the head portion 124a is greater than the inner diameter of the first guiding slot 111e, so the supporting positioning element 120 would not easily fall off the positioning portion 111d.

On the other hand, the first coupling portion 124 has an open slot 124c penetrating the head portion 124a and a portion of the pillar portion 124b, and the head portion 124a is divided into two sub-head portions 124d opposite to each other. Based on the design of the open slot 124c, the operator can apply force to the two sub-head portions 124d or the pillar portion 124b to make the head portion 124a and a portion of the pillar portion 124b elastically deform. At this time, the two sub-head portions 124d move close to each other, and the head portion 124a can move through the first guiding slot 111e to detach the supporting positioning element 120 from the positioning portion 111d. It should be noted that the manner in which the supporting positioning element 120 is assembled to the positioning portion 111d is roughly similar to the manner in which the supporting positioning element 120 is disassembled from the positioning portion 111d. The difference is that the assembly direction is opposite to the disassembly direction.

It is worth mentioning that other engaging points can be added between the second engaging point F2 of the first guiding section G1 and the junction of the second guiding section G2 and the first guiding section G1. As a result, the supporting positioning element 120 can be locked between the second engaging point F2 of the first guiding section G1 and the junction of the second guiding section G2 and the first guiding section G1, and thus meeting the assembly requirements for other expansion cards which have different sizes.

Based on the above, the assembling structure for the expansion card of the disclosure is configured with the supporting positioning element that can be compatible for at least two different sizes of expansion cards. The operator can adjust the position and direction of the supporting positioning element on the frame according to the sizes of the expansion cards. Also, after the supporting positioning element is moved and positioned, the operator can lock the supporting positioning element to the frame to prevent the supporting positioning element from arbitrarily sliding or rotating relative to the frame. As such, after the expansion card is assembled to the frame, an end of the expansion card that is not supported by the frame can be supported and fixed by the supporting positioning element to prevent the expansion card from loosening from the frame and to improve the reliability of the assembly between the expansion card and the frame. On the other hand, the frame and the supporting positioning element can form a three-point support for the expansion card, which helps to reduce the vibration amplitude of the expansion card when the host computer, server or workstation is in operation. Furthermore, the electrical contact of the expansion card can be firmly and securely plugged into the electrical connection socket of the frame to prevent damage to the electrical contact of the expansion card and improve signal transmission stability.

Although the disclosure has been described with reference to the above embodiments, it will be apparent to the person of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. An assembling structure for an expansion card suitable for assembling an expansion card, comprising:
    a frame, comprising a body, a first assembling portion and a second assembling portion, wherein the body has a first side, a second side, and a third side opposite to the second side, the first side is located between the second side and the third side, the first assembling portion is disposed at the first side, the second assembling portion is disposed at the second side, and the body is configured with a positioning portion close to the third side; and
    a supporting positioning element, slidably connected to and pivoted to the positioning portion, wherein the supporting positioning element comprises a first supporting positioning portion and a second supporting positioning portion opposite to each other,
    the supporting positioning element facing the second assembling portion via the first supporting positioning portion or the second supporting positioning portion,
    wherein a distance between the supporting positioning element and the second assembling portion is adjustable based on a movement of the supporting positioning element,
    the supporting positioning element comprises a first coupling portion and a supporting portion opposite to the first coupling portion, the first coupling portion and the supporting portion are respectively located at two opposite sides of the first supporting positioning portion and the second supporting positioning portion, the positioning portion has a first guiding slot, and the first coupling portion is slidably connected to and pivoted to the first guiding slot.

2. The assembling structure for the expansion card according to claim 1, wherein an extension direction of the first guiding slot intersects the second side and the third side.

3. The assembling structure for the expansion card according to claim 1, wherein the supporting positioning element further comprises a second coupling portion adjacent to the first coupling portion, the second coupling portion and the supporting portion are respectively located at two opposite sides of the first supporting positioning portion and the second supporting positioning portion, the positioning portion further has a second guiding slot adjacent to the first guiding slot, and the second coupling portion is slidably connected to and pivoted to the second guiding slot.

4. The assembling structure for the expansion card according to claim 3, wherein the second guiding slot has a first engaging point and a second engaging point opposite to each other, and the second engaging point is located between the first engaging point and the third side.

5. The assembling structure for the expansion card according to claim 3, wherein the second guiding slot has a first guiding section and a second guiding section connected to each other, and the extension direction of the first guiding slot is parallel to an extension direction of the first guiding section.

6. The assembling structure for the expansion card according to claim 5, wherein the first guiding slot has a first end point and a second end point opposite to each other, the second end point is located between the first end point and the third side, the first end point is located between the second guiding section and the second end point, and the second guiding section surrounds the first end point.

7. The assembling structure for the expansion card according to claim 6, wherein the second guiding section is an arc-shaped section, and a concave arc surface of the arc-shaped section faces the first end point of the first guiding slot.

8. The assembling structure for the expansion card according to claim 5, wherein the first coupling portion is located in the first guiding slot, the second coupling portion is located in the first guiding section of the second guiding slot, and a straight line between a center of the first coupling portion and a center of the second coupling portion is perpendicular to the extension direction of the first guiding slot.

9. The assembling structure for the expansion card according to claim 1, wherein the first coupling portion comprises a head portion and a pillar portion connected to the head portion, the pillar portion is inserted in the first guiding slot, and the head portion extends out through the first guiding slot.

10. The assembling structure for the expansion card according to claim 9, wherein the first coupling portion has an open slot penetrating the head portion and a portion of the pillar portion, and the head portion is divided into two sub-head portions opposite to each other.

11. The assembling structure for the expansion card according to claim 1, wherein the first assembling portion is configured with an electrical connection socket, and the expansion card is configured with an electrical contact for plugging into the electrical connection socket.

12. The assembling structure for the expansion card according to claim 1, wherein the supporting positioning element faces the second assembling portion via the first supporting positioning portion, and a first distance is kept between the first supporting positioning portion and the second assembling portion, or the supporting positioning element faces the second assembling portion via the second supporting positioning portion, and a second distance greater than the first distance is kept between the second supporting positioning portion and the second assembling portion.

* * * * *